(12) United States Patent
Shifrin (10) Patent No.: US 6,621,341 B1
(45) Date of Patent: Sep. 16, 2003

(54) DIAGNOSTIC MEDICAL ULTRASOUND SYSTEMS HAVING A METHOD AND CIRCUITRY FOR FRONT-END GAIN CONTROL

(75) Inventor: Lazar A. Shifrin, San Jose, CA (US)

(73) Assignee: Acuson Corporation, Mountain View, CA (US)

( * ) Notice: Subject to any disclaimer, the term of this patent is extended or adjusted under 35 U.S.C. 154(b) by 0 days.

(21) Appl. No.: 09/576,586

(22) Filed: May 22, 2000

(51) Int. Cl.⁷ .............................. H03F 1/00; H03F 1/36; H03F 3/45; H03G 3/20; H03G 3/10

(52) U.S. Cl. ..................... 330/174; 330/110; 330/141; 330/254; 330/278

(58) Field of Search ................................ 330/110, 141, 330/174, 254, 278, 281

(56) References Cited

U.S. PATENT DOCUMENTS

| | | | | |
|---|---|---|---|---|
| 3,972,228 A | * | 8/1976 | Mansson | 330/281 |
| 4,373,394 A | * | 2/1983 | Renzel et al. | |
| 4,851,791 A | * | 7/1989 | Marotel | 331/158 |
| 5,603,324 A | * | 2/1997 | Oppelt et al. | |
| 5,609,154 A | * | 3/1997 | Oppelt et al. | |
| 5,641,908 A | * | 6/1997 | Hayakawa | |
| 5,724,312 A | | 3/1998 | Oppelt | 367/98 |
| 6,150,649 A | * | 11/2000 | Wake et al. | 250/208.1 |

FOREIGN PATENT DOCUMENTS

DE    195 05 697 A1  *  8/1996

OTHER PUBLICATIONS

Burr-Brown® VCA610 specification brochure "Wideband Voltage Controlled Amplifier", Jan., 1995, 12 pages.

* cited by examiner

Primary Examiner—Patricia Nguyen (57) ABSTRACT

A system and method of processing received signals in an ultrasound imaging system is disclosed. In the system, the received signals are amplified by means of a gain controlled amplifier, and the gain of the amplifier is varied, by varying the load capacitance, as a function of depth (time) to compensate for the attenuation of ultrasonic energy at different depths within a patient's body.

20 Claims, 7 Drawing Sheets

DIAGNOSTIC MEDICAL ULTRASOUND SYSTEMS HAVING A METHOD AND CIRCUITRY FOR FRONT-END GAIN CONTROL

BACKGROUND

Figure 1:
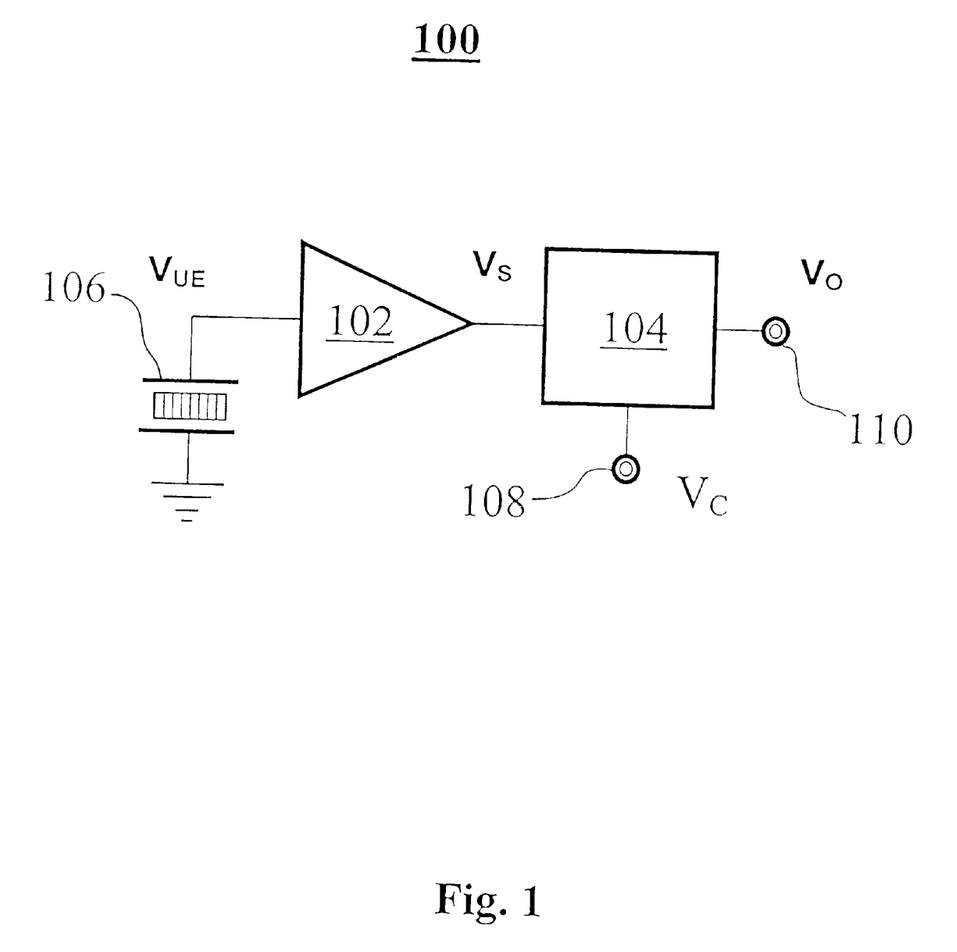
FIG. 1 schematically illustrates a gain-controlled front-end amplifier circuit as known in the art.

In a medical ultrasound system, echoes received by an ultrasound transducer are amplified by a front-end subsystem, i.e., a set of circuitry that is first to receive and process the signals provided by the transducer. As shown in FIG. 1, the front-end 100 includes a first amplifier 102, ("pre-amplifier"), cascaded with a variable gain amplifier 104 ("VGA"). The pre-amplifier 102 is coupled with a piezoelectric ultrasound transducer 106. Since the combined impedance of the piezoelectric ultrasound transducer 106 and its connecting cable (not shown) is essentially capacitive, the purpose of the pre-amplifier 102 is to convert the high impedance charge input into a usable output voltage.

Figure 2:
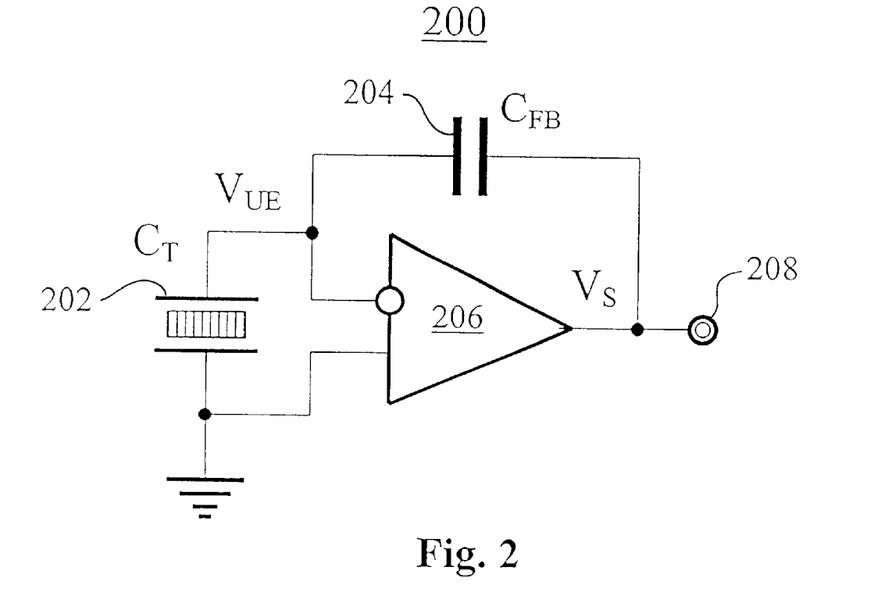
FIG. 2 illustrates a charge sensitive pre-amplifier for medical ultrasound as known in the art.

Generally, two pre-amplifier 102 topologies are used. The first, known as a charge sensitive amplifier, utilizes an operational amplifier ("Op Amp"). FIG. 2 shows a pre-amplifier 200 which works as a charge integrator. The electrical charge from the transducer 202 is compensated by a charge of equal magnitude and opposite polarity, producing a voltage across the feedback capacitor 204, labeled "$C_{FB}$". In effect, the charge sensitive amplifier 200 provides a $C_T/C_{FB}$ voltage gain, where $C_T$ is the equivalent capacitance of the transducer 202.

Figure 3:
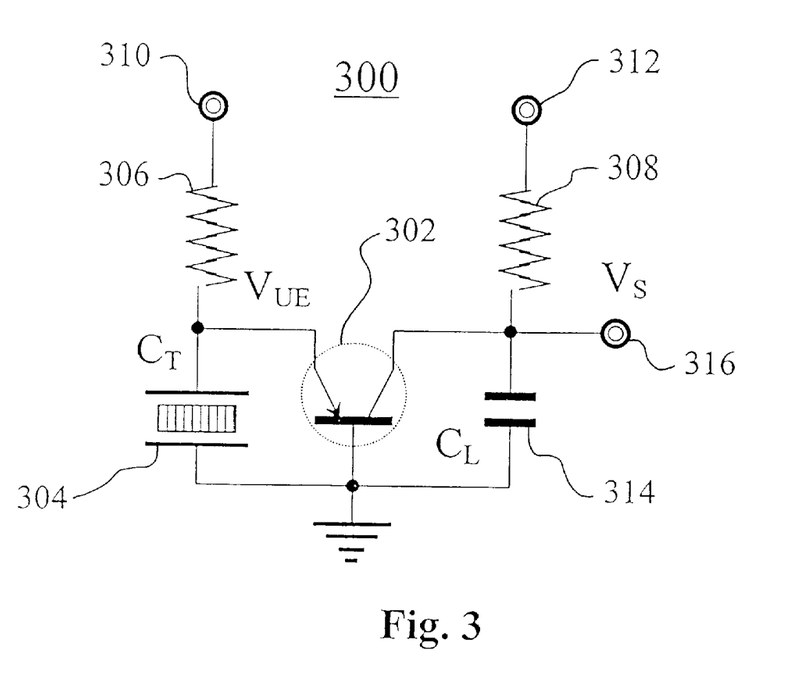
FIG. 3 illustrates a common-base transistor pre-amplifier as known in the art.

Another known pre-amplifier 300 architecture, shown in FIG. 3, employs a low-noise bipolar transistor 302 in a common-base configuration. Prior knowledge of the transducer 304 impedance is used to configure the pre-amplifier 300 so that the collector has an essentially capacitive load 314, labeled "$C_L$". Having approximately unity current gain, this pre-amplifier 300 causes the output charge to be equal to the input. As a result, a $C_T/C_L$ voltage gain is achieved.

Referring back to FIG. 1, to compensate for the attenuation of ultrasound energy at different depths, prior art systems further utilize a variable gain-controlled amplifier 104. An exemplary VGA 104 is described in U.S. Pat. No. 4,331,929, entitled "GAIN-CONTROLLED AMPLIFIER" to Yokoyama. The VGA 104 adjusts the front-end gain as a function of time and/or attenuating characteristics of body tissues.

Maintaining an extensive signal range, the VGA 104 that is incorporated into a medical ultrasound system preferably provides both a low noise floor and the ability to attenuate exceptionally strong echoes while allowing progressively greater gain for echoes from deeper structures.

SUMMARY

The present invention is defined by the following claims, and nothing in this section should be taken as a limitation on those claims. By way of introduction, one aspect of the present invention is a method for controlling input gain in a diagnostic medical ultrasound system. The method comprises receiving a plurality of ultrasound signals from a piezo-electric ultrasound transducer; varying the gain of the signals utilizing a variable capacitance; and controlling the variance of the gain as a function of the variable capacitance.

Another aspect of the present invention is a gain controlled input stage for a diagnostic medical ultrasound system. The input stage includes an ultrasound transducer, a variable capacitance circuit and an amplifier coupled with the ultrasound transducer and the variable capacitance circuit wherein the gain of the amplifier is responsive to the variable capacitance circuit.

DETAILED DESCRIPTION OF THE PRESENTLY PREFERRED EMBODIMENTS

The preferred embodiments relate to a method of processing received signals in an ultrasound imaging system, in which the received signals are amplified by means of a gain controlled amplifier having a variable capacitance. The gain of the amplifier is varied, by varying the variable capacitance, as a function of depth (time) to compensate for the attenuation of ultrasonic energy at different depths within a patient's body. The preferred embodiments also relate to an apparatus for attenuation compensation, comprising a gain-controlled amplifier connected with a pre-amplifier, which is used to expand the magnitude of echoes received by the transducer.

Referring now to FIGS. 1–4, the basic operation of a medical ultrasound front-end is described. FIG. 1 shows a block diagram for a known ultrasonic front-end 100. The front-end 100 couples the transducer 106 with the rest of the ultrasound system (not shown) and provides the initial processing of the returned ultrasonic echoes. Herein, the phrase "coupled with" means directly connected to or indirectly connected with through one or more intermediate components. During reception, the piezoelectric transducer 106 provides ultrasound echoes to the front-end 100 as an electrical signal labeled "$V_{UE}$". The echoes are amplified in a first amplifier 102 ("pre-amplifier"). After amplification, the amplified echoes, labeled "$V_S$", are applied to a variable gain amplifier 104 ("VGA"). The VGA 104 gain is controlled by an external control signal 108, labeled "$V_C$". The VGA 104 outputs an amplitude-controlled output signal 110, labeled "$V_O$".

FIG. 2 shows a medical ultrasound pre-amplifier 200 configured as a charge sensitive amplifier. Besides a transducer 202, the pre-amplifier 200 includes an operational amplifier ("Op Amp") 206 and a feedback capacitor 204 having a capacitance value of $C_{FB}$. There is an output terminal 208, labeled "$V_O$", from which to derive the amplified echoes.

An alternate pre-amplifier 300 is presented by FIG. 3. This pre-amplifier 300 is arranged as a conventional common-base transistor amplifier. Its direct current ("DC") operating point is set by two resistors, 306 and 308, connected to the power supply terminals 310 and 312. However, for ultrasound-specific applications, there is a difference in the considerations of the basic design. Specifically, the transistor 302 is driven by the source, i.e. the transducer 304, having capacitive impedance. Thus, in order to obtain a flat frequency response, the transistor 302 collector load is preferably essentially capacitive. Accordingly, the pre-amplifier 300 further includes a capacitor 314 with a capacitance value of $C_L$. The amplified signal 316, labeled "$V_0$" is obtained from the collector of the transistor 302.

Figure 4:
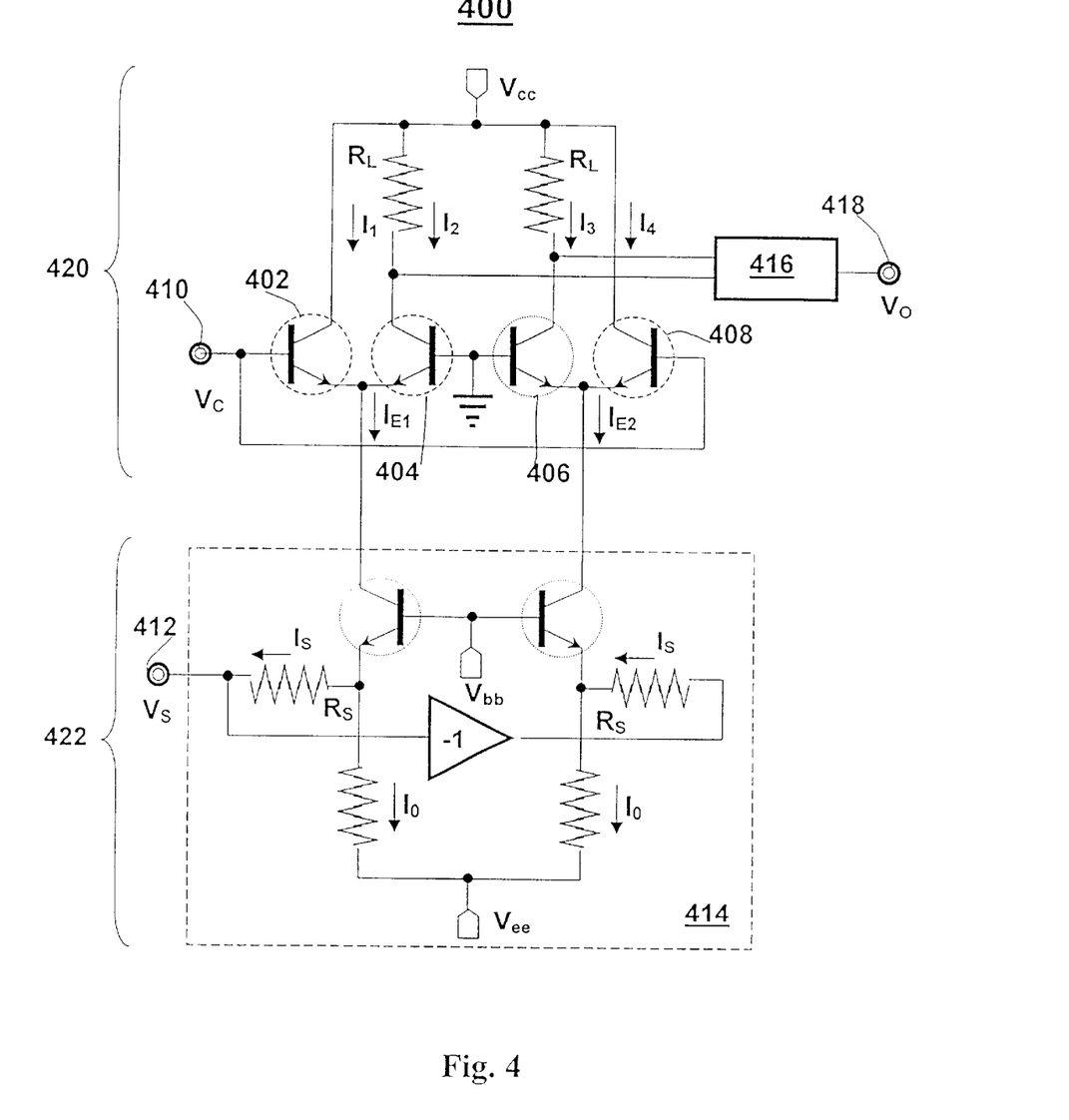
FIG. 4 shows a gain-controlled amplifier as known in the art.

FIG. 4 shows a variable gain amplifier 400 ("VGA"). The VGA 400 includes a first set of differential transistors 402 and 404 and a second set of differential transistors 406 and 408, where the base of a transistor 402 and 408 from each set commonly connects to a control signal input terminal 410 to receive a gain control signal, labeled "$V_C$". The input signal, labeled "$V_S$", whose magnitude is to be controlled, is applied to a signal terminal 412. A differential voltage-to-current converter 414 coupled to the signal terminal 412 derives the common-emitter current of differential transistors 402 and 404 and the common-emitter current of differential transistors 406 and 408 in the opposite phase relation with respect to each other. The collectors of transistors 404 and 406 are connected to a voltage subtractor 416 having an output terminal 418 from which the amplitude-controlled output signal, labeled "$V_0$" is obtained.

In operation, the VGA 400 steers the common-emitter currents, labeled "$I_{E1}$" and "$I_{E2}$" of differential transistors 402, 404, 406 and 408 in accordance with an exponential function of the externally applied control voltage, $V_C$. More specifically, the collector currents, labeled "$I_2$" and "$I_3$", flowing through the load resistors, labeled "$R_L$", are given by:

$$I_2 := \frac{I_{E1}}{\exp\left(\frac{V_C}{\phi}\right)+1}$$

$$I_3 := \frac{I_{E2}}{\exp\left(\frac{V_C}{\phi}\right)+1}$$

$$\phi := \frac{kT}{q}$$

where k is the Boltzmann constant, q is the elementary charge, and T is absolute temperature. The common-emitter currents, $I_{E1}$ and $I_{E2}$, is expressed as:

$$I_{E1}=I_0+I_S$$

$$I_{E2}=I_0-I_S$$

where $I_0$ and $I_S$ are DC and signal components of the above currents, respectively.

The signal component of the common emitter currents, $I_{E1}$ and $I_{E2}$ is generated by the differential voltage-to-current converter 414. Since the input signal, $V_S$, is applied through the resistors, labeled "$R_S$", to the low-impedance node, the magnitude of $I_S$, is calculated as $$I_S=V_S/R_S$$

The output signal, $V_0$, of the VGA is defined as the voltage difference between the collectors of transistor 404 and 406. Therefore:

$$V_0=R_L(I^3-I^2)$$

Linking the above equations, the gain, G, of the VGA 400 is given by $$G := \frac{V_0}{V_S} = \frac{G_{MAX}}{\exp\left(\frac{V_C}{\phi}\right)+1}$$

where $G_{MAX}=2R_L/R_S$.

In one embodiment, the VGA 400 limits harmonic distortions. The VGA 400 operates as a Class A amplifier, i.e., without clipping. To provide low level harmonic distortions, the, $I_S$, and DC, $I_0$, components of the emitter current are calculated as follows:

$$I_S<I_0$$

$$I_0>V_S/R_S$$

In practice, the resistance value of $R_L$ is limited by the required bandwidth of the VGA 400 while the maximum available gain, $G_{MAX}$ is typically greater than 1, however lower values may be used. (For $G_{MAX} \leq 1$, the downstream noise affects the overall system performance.) For this embodiment, the maximum value of $R_S$, denoted as $R_{SM}$, is given by $$R_{SM}=2R_{LM}/G_{MAX}$$

where $R_{LM}$ is the allowed maximum of $R_L$.

Consequently, once the maximum peak input signal $V_{SM}=I_0 \times R_{SM}$ is reached, $I_0$ is increased to ensure the VGA's 400 linearity. However, the increase in the common-emitter current correspondingly increases noise produced within the VGA 400 circuit. Conversely, when the common-emitter current is decreased so as to reduce noise, the linear operating range of the amplifier is degraded exhibiting an increase of harmonic distortions.

The dynamic range of operation of a given system is measured by the ratio of the magnitude of the largest and smallest inputs. The largest input that a system can handle is limited by its non-linearity that causes distortions at the output. The smallest input that can be detected is limited by the system's input-referred noise floor.

It is known that body tissues attenuate the transmitted ultrasound energy at a rate of approximately 1 dBMHz/cm. To compensate for this rapid attenuation, prior art ultrasound systems incorporate circuitry as described above, which acts to increase receiver gain during a time, which follows the penetration of a pulse into the body.

The lower limit of the dynamic range (or maximum gain) is determined by the smallest echoes that produce a given output signal to noise ratio. Afterward, the gain is just reduced to accommodate strong echoes. Thus, the gain controlled front-end is equally capable of amplifying weak echoes and attenuating strong echoes. This is done by using a two-cascade front-end, as described above, where the first stage (this first amplifier is typically referred to as a pre-amplifier) is set to a fixed gain while the gain of the second stage is varied.

Even if the pre-amplifier has a wide dynamic range (low noise), the dynamic range at the front-end output is reduced by the accumulation of noise and distortion from the variable-gain stage following the pre-amplifier. Accordingly, the idea of the preferred embodiments described below is eliminate the need for a variable gain amplifier and, instead, adjust the gain of the pre-amplifier itself.

Since the combined impedance of a piezo-electric ultrasound transducer and connecting cable is essentially capacitive ($C_T$), the pre-amplifier should act as a charge sensitive amplifier producing a usable voltage across a capacitive load ($C_{FB}$ in FIG. 2 or $C_L$ in FIG. 3). In such a case, the voltage gain is defined by the input/output capacitance ratio and, therefore, can be controlled by varying the capacitive load ($C_{FB}$ or $C_L$). Dealing with a reactance rather than with a power-dissipated circuit, the preferred embodiments utilizing front-end gain control do not exhibit additional noise and, as shown below, have a virtually unlimited control range.

Figure 5:
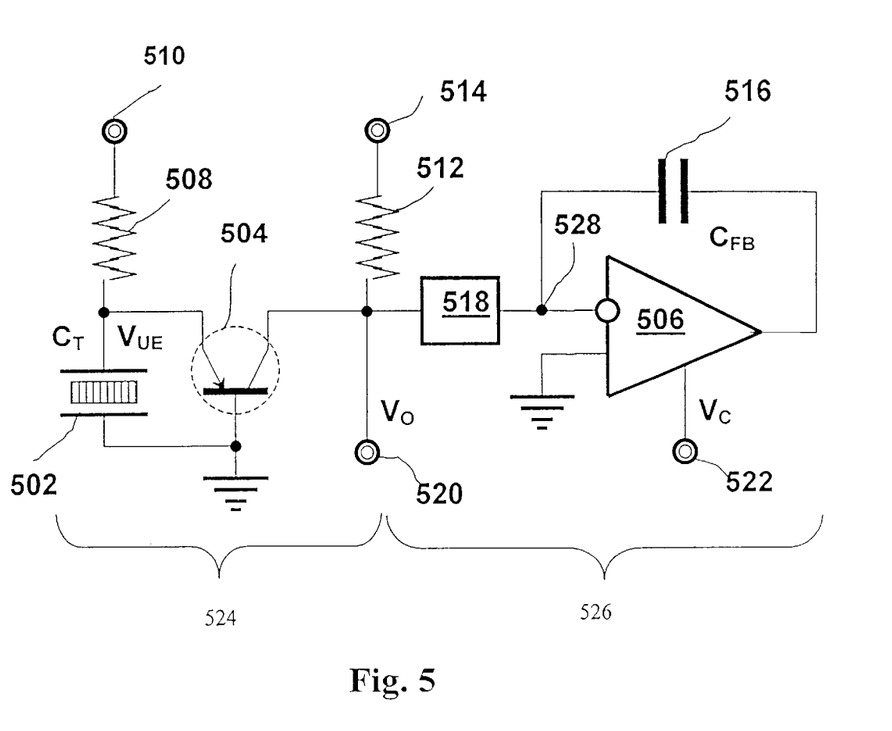
FIG. 5 is a block diagram of a first preferred embodiment of a front-end subsystem.

FIG. 5 illustrates a first embodiment of a variable gain front-end 500 which allows for a reduction of noise without a corresponding degradation of linear operating range and increase in harmonic distortions. The variable gain front-end 500 comprises a pre-amplifier 524 and an inverting integrator 526 having a controllable open-loop gain, G. The pre-amplifier 524 includes a piezoelectric transducer 502 and a common-base transistor stage 504. A resistor 508 connects to a power supply terminal 510 to determine the transistor 504 operating current and, therefore, the transistor 504 input impedance. A resistor 512 coupled to another power terminal 514 sets the collector voltage of the transistor amplifier 504.

The variable gain integrator 526 is composed of a variable gain inverting 30 amplifier 506 and a feedback capacitor 516. The inverting node of the amplifier 506 is driven by the output of the pre-amplifier 524 being connected through a level shifter 518. The pre-amplifier 524 output is also coupled to an output terminal 520 to derive the amplitude-controlled echo signal, labeled "$V_O$". A control terminal 522 provides an external voltage, labeled "$V_C$" to adjust the front-end gain.

The echoes, $V_{UE}$, provided by the transducer are applied to the emitter of the common-base transistor 504 whose output terminal, $V_O$, is terminated by the inverting node of the integrator 526. Consequently, the preamplifier gain depends on the impedance at this node. Since an externally applied control voltage, $V_C$, sets the integrator open-loop gain, G, and, therefore, varies the exhibited impedance, the front-end signal gain, A, becomes a function of G, i.e., $$A(G)=V_O/V_{UE}$$

For a finite gain amplifier with the negative feedback applied via impedance $Z_{FB}$, the input impedance at the inverting node, $Z_{IN}$ is given by the following expression $$Z_{IN}=Z_{FB}/(G+1)\|Z$$

where Z is the open-loop input impedance.

Considering an inverting integrator, the value of $Z_{FB}$ is defined by the reactance provided by the feedback capacitor $C_{FB}$. Thus, for $Z\to\infty$, the inverting node appears as a $(G+1)\times C_{FB}$ capacitance. Since the collector of the transistor is directly connected to the inverting node, the pre-amplifier arrangement in FIG. 5 is similar to the one in FIG. 3. However, the output of the pre-amplifier 300 of FIG. 3 is loaded by a fixed capacitive load 314 while the pre-amplifier 500 in FIG. 5 of the preferred embodiment is coupled with the simulated capacitance provided by the integrator 526 at its inverting node 528.

Equating the load capacitance $C_L$ in FIG. 3 with the inverting node appearance, $(G+1)\times C_{FB}$, the gain of the present front-end of FIG. 5 is expressed as:

$$A = \frac{C_T}{C_{FB}(G+1)}$$

As is evident from the above equation, the signal gain of the front-end configured as shown in FIG. 5 decreases with an increase of the open-loop gain of the integrator. From a theoretical standpoint, the signal gain may be set as high as $C_T/C_{FB}$. However, there is no low limit to the signal attenuation when G approaches infinity. Thus, the preferred method of front-end gain control in ultrasound has virtually unlimited dynamic range.

As discussed above, the front-end signal gain is given by:

$$A = \frac{C_T}{C_{FB}\cdot(G+1)}.$$

According to the first embodiment, the front-end output terminal 520 drives the integrator input 528 through a level shifter. Thus, the gain at the integrator output can be expressed as $A\cdot G$. Consequently, $A\cdot G=C_T/C_{FG}(1+1/G)$. Therefore for G>1, the integrator output provides a signal gain of about $C_T/C_{FB}$ which is independent of the selected open-loop gain. Since the above ratio approaches the maximum gain of the pre-amplifier, it will be understood that there is less or no risk of overdriving the overall system if the pre-amplifier 524 operates as a linear device. Thus, within the pre-amplifier dynamic range, the output is substantially free of distortion.

Since the embodiment discussed above adjusts an equivalent capacitance, little or no additional thermal or shot noise is caused by the gain control operation. Moreover, the preferred gain control mechanism adequately reduces the signal and noise gain of the pre-amplifier. Thus, the signal to noise ratio ("SNR") is progressively increased for echoes having greater magnitude.

Considering further gain-related factors, stray capacitance $C_O$ may be caused by the transistor base-collector capacitance, the input capacitance of the variable gain amplifier 506, and the parasitic capacitance. As a result, the gain, A, of the gain-controlled front-end is:

$$A = \frac{C_T}{C_0 + C_{FB}(G+1)}$$

Varying the open-loop integrator gain from a minimum, $G_{MIN}$, to a maximum, $G_{MAX}$, the signal gain, A, is altered from a maximum, $A_{MAX}$, to a minimum, $A_{MIN}$. Accordingly, the range of the signal gain adjustment $R_A=A_{MAX}/A_{MIN}$ yields:

$$R_A = \frac{C_0 + C_{FB}\cdot(G_{MAX}+1)}{C_0 + C_{FB}\cdot(G_{MIN}+1)}$$

Choosing $G_{MIN}=1$, the range of gain control approaches $$R_A = \frac{G_{MAX}}{2 + \frac{G_0}{C_{FB}}}$$

While, in practice, $C_O<C_{FB}$ resulting in a 6 to 10 dB loss of potential control range for a given $G_{MAX}$, this limitation does not apply to the preferred embodiments disclosed herein because, theoretically, the open-loop gain G is unlimited and, therefore, the product of $G\times C_{FB}$ can be arbitrarily large. Furthermore, for an integrated front-end configured in accordance with the above described embodiments, the effect of a stray capacitance is limited and may be ignored due to the small value of CO. This is because in an integrated circuit, there is no parasitic capacitance associated with using a printed circuit board.

As was shown above, the pre-amplifier gain is defined as a capacitance ratio ($C_T/C_{FB}$ or $C_T/C_L$). Thus, for a fixed $C_T$, the overall front-end gain is adjusted by varying $C_{FB}$ or $C_L$. In an alternative embodiment, variable capacitance diodes (varactors) whose capacitance depends on an applied voltage are used in place of $C_{FB}$ or $C_L$. However, these devices have a limited control range (up to 26 dB), wide tolerance and may inject some spurious harmonics due to their inherent non-linearity.

Figure 6:
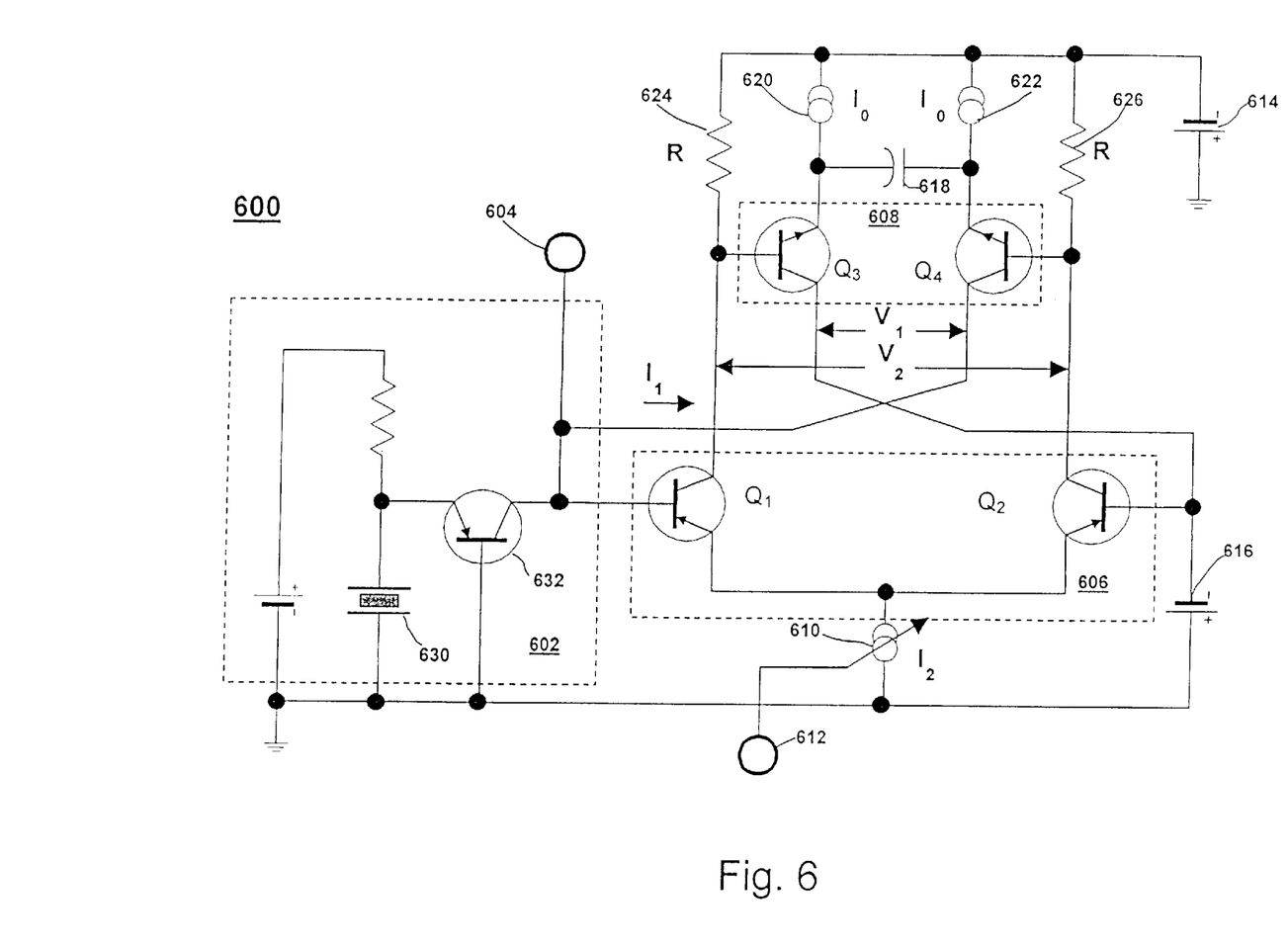
FIG. 6 is a block diagram of a second preferred embodiment of a front end subsystem.

FIG. 6 shows a second embodiment of a variable gain front-end 600 based on the concept of impedance conversion. This variable gain front-end 600 consists of a pre-amplifier 602 and an impedance converter 628. The pre-amplifier 602 includes a piezoelectric transducer 628, and a common-base transistor stage 632. Alternative embodiments may further include filters, clamps, current sources or other components. The variable gain front-end 600 of this second embodiment is similar to the variable gain front-end 500 shown in FIG. 5 except that the integrator 526 incorporated in the circuit of FIG. 5 is replaced by a variable impedance converter 628 capable of electrically multiplying or dividing the impedance.

In the embodiment of FIG. 6, a variable impedance circuit simulates a capacitive load for the pre-amplifier 602. This circuit includes two differential amplifiers 606, 608 having their input and output terminals connected in a negative feedback loop arrangement. A supplied controllable emitter current, $I_2$, varies the gain of the first differential amplifier 606 which includes transistors $Q_1$, $Q_2$. Furthermore, $I_2$ is adjusted in accordance with a potential at the gain control electrode 612.

The second amplifier 608 includes transistors $Q_3$, $Q_4$ having a capacitive element 618 between their emitters and furnished by two constant current sources 620, 622.

Referring back to the first embodiment, the summing junction 528 of the integrator appears as a $(G+1) \times C_{FB}$ capacitance value. Thus, an effective capacitive load seen by the pre-amplifier 524 is not less than $C_{FB}$ (even ignoring the stray capacitance $C_0$). As a result, maintaining the same ratio of $G_{MAX}/G_{MIN}$, the range of the signal gain control for G<1 is much less than for G>1. In contrast, the variable impedance converter multiplies a reference capacitance by a factor K while K may be greater than, equal to or less than one. Thus, variable impedance converters are capable of widening the range of the signal gain control. An exemplary conventional capacitance multiplier of this kind is described in detail in U.S. Pat. No 5,012,201, entitled "VARIABLE IMPEDANCE CIRCUIT" to Morita et al. and shown in FIG. 7.

Figure 7:
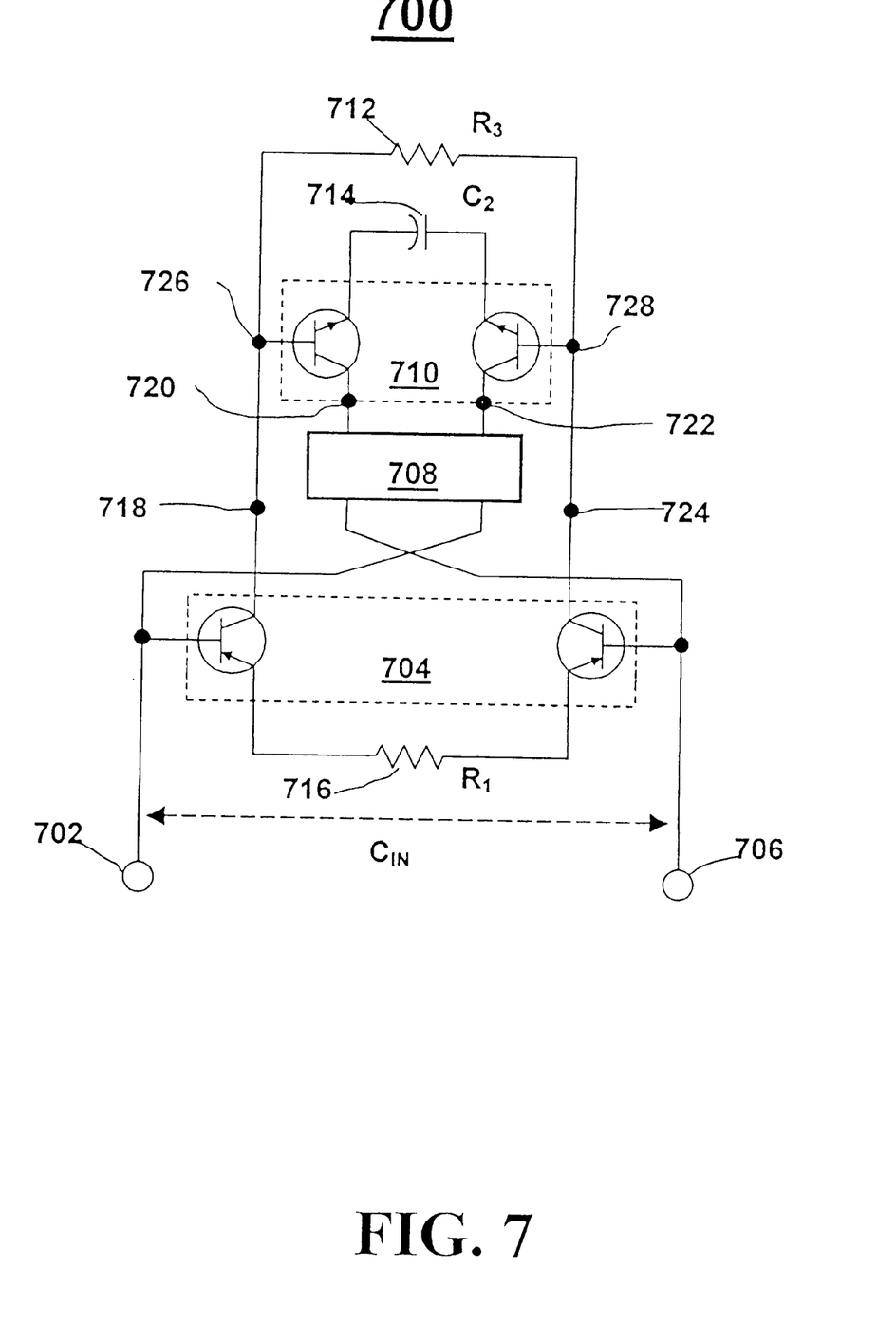
FIG. 7 is a schematic diagram of an impedance converter.

Variable impedance circuits provide a new or different impedance between the pair of input terminals 702, 706 of a first differential amplifier 704 by connecting the output terminal pair 718, 724 of the differential amplifier 704 to the input terminal pair 726, 728 of a second differential amplifier 710. This directly or indirectly connects the output terminal pair 720, 722 of the second differential amplifier 710 to the input terminal pair 702, 706 of the first differential amplifier 704. An impedance element such a capacitor 714 and/or resistor 716 is further connected between the emitters of the transistor pairs composing the first and/or second differential amplifiers 704, 710.

Accordingly, selecting the ratio of resistor components 712, 716 and/or by implementing a current-to-current conversion circuit 708 provides a new or different capacitance value. When a current-to-current converter 708 is used, the output current of the second differential amplifier 710 is scaled by a factor M so that the magnitude of the voltage applied between the input terminals 702, 706 varies. In essence, a new capacitive value of:

$$C_{IN} = C_2 \times M \times R_3/R_1$$

is simulated.

The ratio of $R_3/R_1$ is varied by, for instance, selecting between a plurality of resistors to pick a particular one. However, transients are introduced when there is no resistor plugged into the circuit during the selection process. As a result, the capacitive value and, therefore, the front-end gain are varied. In an alternative solution, a current-to-current conversion block 708, which may include a Gilbert multiplication cell, is added. This alternative may be a further source of harmonic distortions. Other alternatives for varying the ratio of $R_3/R_1$ include using a photo-resistor or a field effect transistor device in an on-state, however, inherent non-linearity and wide tolerances characterize these alternatives.

Referring back to FIG. 6, the second embodiment includes a variable impedance converter 628 incorporating an adjustable current source 610. The converter 628 acts as a capacitor multiplier with the current source 610 establishing a factor, K, by which the value of the reference capacitor 618 and, therefore, the front-end gain are multiplied (divided). In operation, factor K is set externally by the $V_C$. The theory of the converter functionality is described in more detail below.

If the variable source 610 provides a DC current $I_2$, the voltage-to-current conversion factor of the first differential amplifier 606 composed of transistors $Q_1$, $Q_2$ and resistance elements 624, 626 is expressed as:

$$g_{m1} = I_2/2\phi$$

Supposing the input voltage of the first differential amplifier 606 to be $V_1$, the output voltage $V_2$ produced between the input terminals of the second differential amplifier 608 is given as:

$$V2 = -V_1 \times g_{m1} \times R$$

Supposing the voltage-to-current conversion factor of the second differential amplifier 608 to be $g_{m2}$, the output current $I_1$ flowing due to the voltage $V_2$, is given as:

$$I_1 = -g_{m2} \times V_2$$

Thus:

$$I_1 = V_1 \times I_2 \times R \times g_{m2}/2\phi$$

The voltage-to-current conversion factor $g_{m2}$ is determined as a function of the sum of the emitter resistance value $r_{e2}$ of transistors $Q_3$, $Q_4$ of the amplifier 608 and the impedance of the reference capacitance element 618 $Z=1/j\omega C$. Supposing $2r_{e2} << |Z|$ yields:

$$g_{m2} = i\omega C$$

As a result:

$$I_1 = V_1 \times I_2 \times R \times i\omega C/2\phi$$

and a simulated capacitance value becomes:

$$C_{IN} = C \times I_2 \times R/2\phi$$

Given $C_{IN}$, the front-end gain is express as:

$$A = C_T/(C_0 + C_{IN})$$

Varying the $I_2$ from a minimum, $I_{MIN}$ to a maximum, $I_{MAX}$, the signal gain A is altered from a maximum, $A_{MAX}$ to a minimum, $A_{MIN}$. Since $I_{MIN}$ may be negligibly small, $C_{IN} \to 0$ and $A_{MAX} = C_T/C_0$. Thus, the range, $R_A$, of gain control approaches:

$$R_A = 1 + \frac{C}{C_0} \cdot \frac{I_{MAX} \cdot R}{2\varphi}$$

Widening of the gain control range is achieved by increasing $I_{MAX}$ or R, and by selecting an appropriate ratio of the capacitance value C and $C_0$. Therefore, the second embodiment is preferable when reducing the stray capacitance $C_0$ is problematic.

Figure 8:
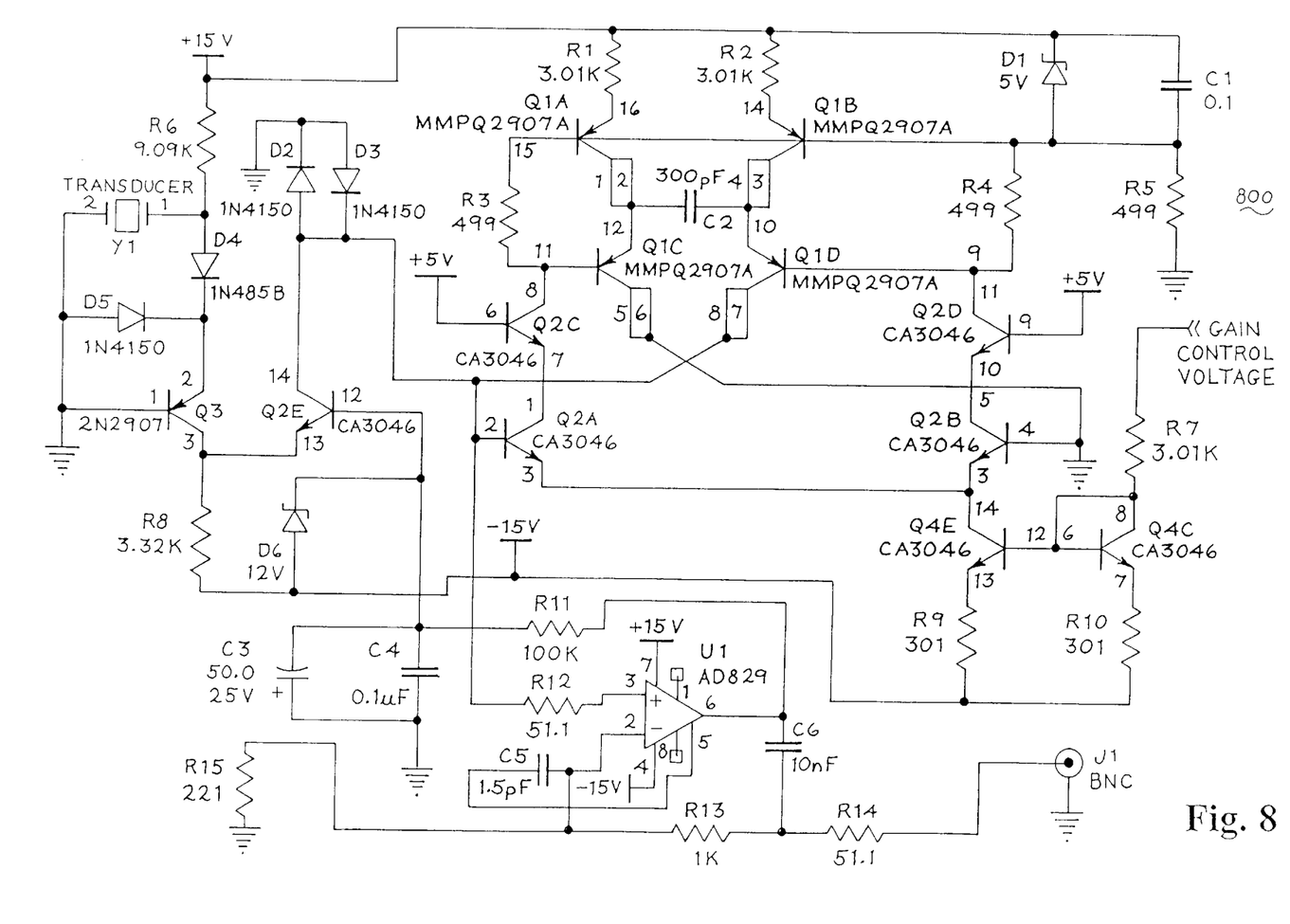
FIG. 8 shows a schematic diagram of a circuit according to the second preferred embodiment.

FIG. 8 shows a schematic diagram of a preferred ultrasound front-end circuit utilizing an impedance converter to provide a virtual capacitance. By varying the load capacitance in the pre-amplifier of the ultrasonic front-end, transducer echo gain control with almost unlimited dynamic range is achieved simultaneously with virtually distortion free output. The load capacitance may be varied using an inverting integrator as shown, an impedance converter or a varactor (i.e. a variable capacitance controlled by a voltage source). Further, a variable capacitance may be implemented by other methods including an electronically or mechanically tuned variable capacitor. The following Table 1.0 identifies the parts and associated manufacturers for the components shown in FIG. 8.

I claim:

1. A method of controlling input gain in a diagnostic medical ultrasound system, comprising:
    (a) receiving a plurality of ultrasound signals from a piezo-electric ultrasound transducer;
    (b) varying a gain of said ultrasound signals utilizing a variable capacitance comprising a variable collector load; and
    (c) controlling (b) as a function of said variable capacitance.

2. The method of claim 1, wherein (b) further comprises varying the input impedance of an inverting integrator.

3. The method of claim 1, wherein (b) further comprises varying a capacitance under control of a voltage source external to said variable capacitance.

4. A method for controlling input gain in a diagnostic medical ultrasound system, comprising:
    (a) transmitting an ultrasound pulse and receiving a plurality of echoes therefrom, said plurality of echoes being characterized by a strength;
    (b) amplifying signals responsive to said received plurality of echoes utilizing an amplifier having a common-base transistor, said amplifier being characterized by a substantially capacitive collector load; and
    (c) varying said collector load capacitance as a function of said strength of said plurality of echoes with a control signal external to said amplifier.

5. The method of claim 4, wherein a first one or more of said plurality of echoes are further characterized by being

TABLE 1.0

| Item | Qty | Ref | Part | Manufacturer | Address |
|---|---|---|---|---|---|
| 1 | 1 | C1 | 0.1 uF | Murata | Smyrna, GA, 30080 |
| 2 | 1 | C2 | 300 pF | Murata | Smyrna, GA, 30080 |
| 3 | 1 | C3 | 50.0 uF | Murata | Smyrna, GA, 30080 |
| 4 | 1 | C4 | 0.1 uF | Murata | Smyrna, GA, 30080 |
| 5 | 1 | C5 | 1.5 pF | Murata | Smyrna, GA, 30080 |
| 6 | 1 | C6 | 10 nF | Murata | Smyrna, GA, 30080 |
| 7 | 1 | D1 | 1N5231 | Microsemi | Santa Ana, CA, 92704 |
| 8 | 3 | D2 | 1N4150 | Fairchild | S. Portland, ME, 04106 |
|   |   | D3 | 1N4150 | Fairchild | S. Portland, ME, 04106 |
|   |   | D5 | 1N4150 | Fairchild | S. Portland, ME, 04106 |
| 9 | 1 | D4 | 1N485B | Microsemi | Santa Ana, CA, 92704 |
| 10 | 1 | D6 | 1N5242 | Microsemi | Santa Ana, CA, 92704 |
| 11 | 1 | J1 | BNC | Amphenol | Wallingford, CT, 06492 |
| 12 | 1 | Q1 | MMPQ2907A | Motorola | Schaumburg, IL, 60196 |
| 13 | 2 | Q2 | CA3046 | Intersil | Palm Bay, FL, 32905 |
|   |   | Q4 | CA3046 | Intersil | Palm Bay, FL, 32905 |
| 14 | 1 | Q3 | 2N2907 | Fairchild | S. Portland, ME, 04106 |
| 15 | 3 | R1 | 3.01K | Vishay | Malvern, PA, 19355 |
|   |   | R2 | 3.01K | Vishay | Malvern, PA, 19355 |
|   |   | R7 | 3.01K | Vishay | Malvern, PA, 19355 |
| 16 | 3 | R3 | 499 | Vishay | Malvern, PA, 19355 |
|   |   | R4 | 499 | Vishay | Malvern, PA, 19355 |
|   |   | R5 | 499 | Vishay | Malvern, PA, 19355 |
| 17 | 1 | R6 | 9.09K | Vishay | Malvern, PA, 19355 |
| 18 | 1 | R8 | 3.32K | Vishay | Malvern, PA, 19355 |
| 19 | 2 | R9 | 301 | Vishay | Malvern, PA, 19355 |
|   |   | R10 | 301 | Vishay | Malvern, PA, 19355 |
| 20 | 1 | R11 | 100K | Vishay | Malvern, PA, 19355 |
| 21 | 2 | R12 | 51.1 | Vishay | Malvern, PA, 19355 |
|   |   | R14 | 51.1 | Vishay | Malvern, PA, 19355 |
| 22 | 1 | R13 | 1K | Vishay | Malvern, PA, 19355 |
| 23 | 1 | R15 | 221 | Vishay | Malvern, PA, 19355 |
| 24 | 1 | U1 | AD829 | Analog Devices | Norwood, MA, 02062 |

It is therefore intended that the foregoing detailed description be regarded as illustrative rather than limiting, and that it be understood that it is the following claims, including all equivalents, that are intended to define the spirit and scope of this invention.

strong and a second one or more of said plurality of echoes are further characterized by being weak, wherein (c) further comprises:
    (c1) attenuating said first one or more of said plurality of echoes; and (c2) increasing, progressively, said gain for said second one or more of said plurality of echoes.

6. The method of claim 4, wherein said collector load capacitance is varied by an input impedance of an inverting integrator.

7. The method of claim 6, wherein said inverting integrator terminates an output of said amplifier, said inverting integrator being characterized by an open-loop gain and further wherein said open-loop gain is controlled by said control signal.

8. The method of claim 4, wherein said collector load capacitance is varied by variable capacitance circuit controlled by an external voltage source.

9. The method of claim 8, wherein said variable capacitance circuit comprises a varactor.

10. The method of claim 4, wherein (c) further comprises varying said input gain as a function of time.

11. The method of claim 4, wherein (c) further comprises compensating for the attenuation of ultrasonic energy at different depths within a subject.

12. A gain controlled input stage for a diagnostic medical ultrasound system comprising:
   an ultrasound transducer;
   a variable capacitance circuit comprising a variable collector load; and
   an amplifier coupled with said ultrasound transducer and with said variable capacitance circuit;
   wherein a gain of said amplifier is responsive to said variable capacitance circuit.

13. The gain controlled input stage of claim 12, wherein said variable capacitance circuit comprises an inverting integrator.

14. The gain controlled input stage of claim 12, wherein said variable capacitance circuit comprises a variable capacitor controlled by an external voltage source.

15. A gain controlled input stage for a diagnostic medical ultrasound system comprising:
   an ultrasound transducer;
   an amplifier coupled with said ultrasound transducer;
   an inverting integrator coupled with said amplifier, said inverting integrator including an input; and
   an output coupled with said input.

16. The gain controlled input stage of claim 15, wherein said inverting integrator is characterized by a controllable open-loop gain.

17. The gain controlled input stage of claim 15, wherein said inverting integrator further comprises a variable gain inverting amplifier and a feedback capacitor.

18. The gain controlled input stage of claim 15, further comprising a level shifter coupled between said amplifier and said inverting integrator.

19. A gain-controlled input stage for a diagnostic medical ultrasound system, comprising:
   a transducer;
   an amplifier further including a transistor characterized by a common-base configuration, said amplifier coupled with said transducer and operative to amplify echo signals received by said transducer, said amplifier further including an emitter resistor and a collector resistor, said emitter and collector resistors coupled between corresponding transistor electrodes and power supply terminals, said amplifier being characterized by a substantially capacitive collector load;
   an output terminal being connected to a collector of said transistor; and
   a gain controller coupled with said collector of said transistor, said gain controller including a variable capacitance coupled with a gain control electrode driven by a control signal external to said variable gain controller.

20. The gain-controlled input stage of claim 19, wherein said gain controller further comprises:
   a capacitor;
   a level shifter; and
   a gain-controlled amplifier, said gain-controlled amplifier further including:
      an inverting input electrode;
      a non-inverting input electrode;
      an output electrode; and
      said gain control electrode;
   wherein said capacitor is coupled between said inverting input electrode and said output electrode, said non-inverting electrode is coupled with ground, and said inverting input electrode is commonly coupled with said capacitor and further coupled through said level shifter to said output terminal.

* * * * *